(12) United States Patent
Kasai et al.

(10) Patent No.: US 11,971,378 B2
(45) Date of Patent: Apr. 30, 2024

(54) THERMAL SENSOR CHIP

(71) Applicants: Takashi Kasai, Kyoto (JP); Koji Momotani, Kyoto (JP)

(72) Inventors: Takashi Kasai, Kyoto (JP); Koji Momotani, Kyoto (JP)

(73) Assignee: MMI SEMICONDUCTOR CO., LTD., Tokyo (JP)

( * ) Notice: Subject to any disclaimer, the term of this patent is extended or adjusted under 35 U.S.C. 154(b) by 121 days.

(21) Appl. No.: 17/653,710

(22) Filed: Mar. 7, 2022

(65) Prior Publication Data
US 2022/0291158 A1 Sep. 15, 2022

(30) Foreign Application Priority Data

Mar. 11, 2021 (JP) ................. 2021-039588

(51) Int. Cl.
H01L 23/00 (2006.01)
G01K 13/02 (2021.01)
G01N 25/18 (2006.01)

(52) U.S. Cl.
CPC ............. G01N 25/18 (2013.01); G01K 13/02 (2013.01); H01L 23/00 (2013.01)

(58) Field of Classification Search
CPC ................................ G01N 25/18; H01L 23/00
USPC ........................................................ 327/512
See application file for complete search history.

(56) References Cited

U.S. PATENT DOCUMENTS

| 9,733,223 | B2 | 8/2017 | Ruellan et al. |
| 10,126,224 | B2 | 11/2018 | Trautmann et al. |
| 2006/0154401 | A1* | 7/2006 | Gardner ............... G01N 27/128 438/53 |
| 2011/0154885 | A1 | 6/2011 | Nakano et al. |
| 2014/0318960 | A1 | 10/2014 | Huang et al. |
| 2017/0363589 | A1 | 12/2017 | Kumar et al. |

FOREIGN PATENT DOCUMENTS

| JP | 2011-137679 | 7/2011 |
| WO | 2014/006648 | 1/2014 |
| WO | 2019/079878 | 5/2019 |

OTHER PUBLICATIONS

Extended European Search Report dated Jul. 15, 2022 with respect to the corresponding European patent application No. 22160800.3.
Office Action mailed on Dec. 13, 2023 with respect to the corresponding European patent application No. 22160800.3.

* cited by examiner

Primary Examiner — Tomi Skibinski
(74) Attorney, Agent, or Firm — IPUSA, PLLC

(57) ABSTRACT

The thermal sensor chip includes a substrate in which a cavity having an opening is formed, a membrane provided on a surface of the substrate so as to cover the opening, and a heater provided on or inside the membrane, wherein the heater includes wires in a mesh form constituted by a conductive member.

11 Claims, 4 Drawing Sheets

THERMAL SENSOR CHIP

CROSS-REFERENCE TO RELATED APPLICATION

The present application is based on and claims priority to Japanese Priority Application No. 2021-039588 filed on Mar. 11, 2021, the entire contents of which are hereby incorporated herein by reference.

BACKGROUND

1. Field of the Invention

The present disclosure relates to a thermal sensor chip.

2. Description of the Related Art

There are various conventional gas sensors that determine the type and concentration of gas. One of such conventional gas sensors is a thermal gas sensor that uses a difference in temperature characteristics of thermal conductivity of gas.

SUMMARY

An aspect of an embodiment of the present disclosure provides a thermal sensor chip including a substrate in which a cavity having an opening is formed, a membrane provided on a surface of the substrate so as to cover the opening, and a heater provided on or inside the membrane, wherein the heater includes wires in a mesh form constituted by a conductive member.

DESCRIPTION OF THE EMBODIMENT

Figure 1:
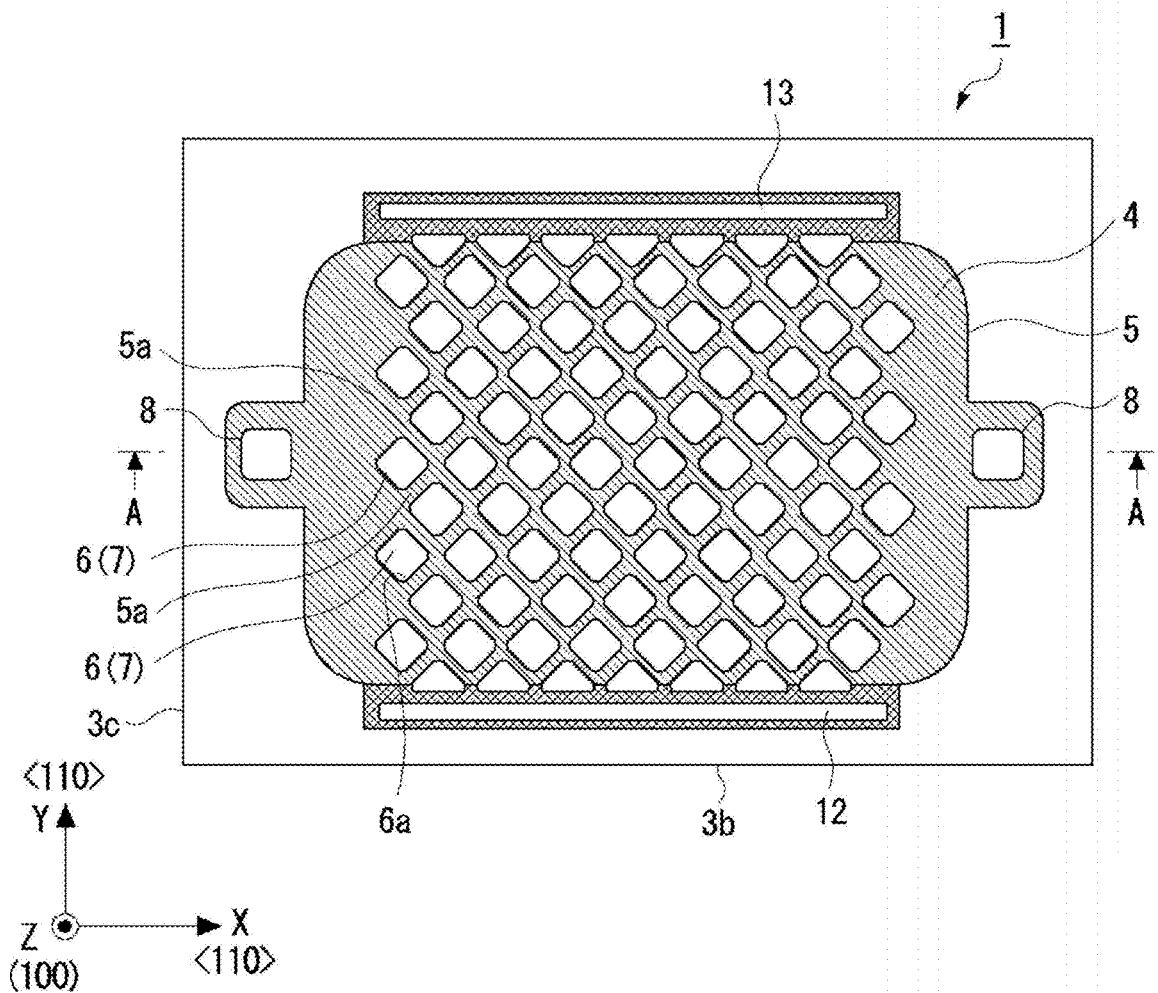
FIG. 1 is a plan view illustrating a thermal sensor chip according to an embodiment.

There are various conventional gas sensors that determine the type and concentration of gas. One of such conventional gas sensors is a thermal gas sensor that uses a difference in temperature characteristics of thermal conductivity of gas (see Japanese Patent No. 5055349). With such a thermal gas sensor, when a gas to be detected comes into contact with a sensor chip constituted by a resistor such as platinum heated to a high temperature, the state of heat dissipation to the gas changes according to the thermal conductivity unique to the gas, and the temperature of the sensor chip changes. As the temperature changes, the resistance value of the resistor constituting the sensor chip also changes. Because the change in the resistance value differs according to the concentration (humidity) of the gas and the gas type, the gas concentration and the gas type can be determined by extracting the amount of change in the resistance value as a voltage with a bridge circuit.

In order to improve the detection sensitivity, it is important for the above-described thermal gas sensor to dissipate heat of the resistor, as much as possible, to the gas to be detected. For example, in the thermal gas sensor of Japanese Patent No. 5055349, the heating element is arranged to meander, so that the heat dissipation performance for dissipating heat to gas is improved.

However, because the heating element is arranged to meander, the entire length of the heating element increases, and accordingly the resistance value also increases. As a result, the temperature of heat generated by the heating element is difficult to increase, which may result in reduction of the detection sensitivity.

Accordingly, it is desired to provide a thermal sensor chip with a high heat dissipation performance for dissipating heat to gas.

In order to solve the above-described problems, one aspect of the present disclosure is a thermal sensor chip including a substrate in which a cavity having an opening is formed, a membrane provided on a surface of the substrate so as to cover the opening, and a heater provided on or inside the membrane, wherein the heater includes wires in a mesh form constituted by a conductive member.

According to this aspect, the wires are in the mesh form, and accordingly, as compared with a meandering heater, the heat can achieve a low resistance, increase the temperature of generated heat, and reduce the power consumption. Furthermore, while an increase of the resistance of the heater is alleviated, the area of the heater can be increased, and accordingly, the heat dissipation performance for dissipating heat to the gas to be detected can be increased.

In this case, the substrate is preferably constituted by a material such as, for example, monocrystalline silicon or a ceramic, which are less likely to change the shape in response to a change in the temperature. Further, the substrate may be a material that can be readily processed with a high degree of accuracy by a semiconductor process. For example, in a case where a cavity is formed by etching of a semiconductor process, the use of monocrystalline silicon allows for easy control of the shape of the cavity. Furthermore, it is preferable that the cavity is formed inside the substrate, and at least one surface of the substrate has an opening. Note that the cavity may have openings on both of the surfaces of the substrate so as to penetrate the substrate. The membrane may have any configuration so long as the membrane can envelope the heater, and the material of the membrane is not particularly limited. In view of currents flowing through the heater, the material of the membrane is preferably an insulating thin film that can be formed by a semiconductor process. Furthermore, the heater provided inside the membrane does not have to be completely enveloped, and a portion of the heater may be exposed to the outside or joined with other components. Furthermore, the heater may be a material that can serve as a resistor, and may be, for example, a metal such as platinum and a ceramic such as polycrystalline silicon.

In the heater, a plurality of first holes may be regularly formed between the wires. The plurality of first holes may be formed in, for example, a staggered arrangement or a honeycomb arrangement. In this case, the heat of the heater can be evenly dissipated to gas.

The membrane may be an insulating material that envelopes the heater, and may share the plurality of first holes with the heater in a plan view of the surface of a substrate 3. In this case, heat can be dissipated not only from the surface of the heater enveloped in the membrane but also from inner walls of the first holes.

The substrate may be a silicon-based material. The silicon-based material is, for example, monocrystalline silicon and polycrystalline silicon.

The substrate is monocrystalline silicon in a rectangular shape, with a plane direction of the surface of the substrate conforming to the (100) plane and axial directions of edges of the substrate conforming to the <110> directions. In this case, the cavity in a predetermined shape can be accurately formed through the surface of the substrate 3 by using anisotropic etching of crystals of silicon. Therefore, the heat dissipation performance for dissipating heat to the gas that passes through the cavity is stabilized, and variation of the detection sensitivity due to individual difference of chips can be reduced.

One of the plurality of first holes may overlap with another of the plurality of first holes that is adjacent to the one of the plurality of first holes, as viewed in axial directions along the edges of the monocrystalline silicon. In this case, the cavity can be readily formed by allowing a predetermined etching solution (potassium hydroxide (KOH) or 4-methylammonium hydroxide (TMAH)) to permeate the surface of the substrate 3 through the first holes. Furthermore, because the cavity can be formed after the membrane and the heater are formed on the substrate, the degree of freedom in the steps of the manufacturing process of the thermal sensor chip increases.

The heater may be provided with a pair of metal terminals, and the wires may include a plurality of conductive paths connected in parallel and connected in series between the pair of metal terminals. In this case, the resistance between the metal terminals can be reduced. In this case, the metal terminals are constituted by, for example, a metal including an element such as gold, platinum, silver, or the like, or an alloy thereof.

The cavity may be a recessed portion with a bottom portion, and the cavity may have side surfaces having a taper angle from the opening toward the bottom portion. In this case, the cavity does not penetrate through the front and back surfaces of the substrate, and therefore, the rigidity of the entirety of the thermal sensor chip including the substrate increases.

According to the present disclosure, a thermal sensor chip with a high heat dissipation performance for dissipating heat to gas can be provided.

Application Example

Figure 2:
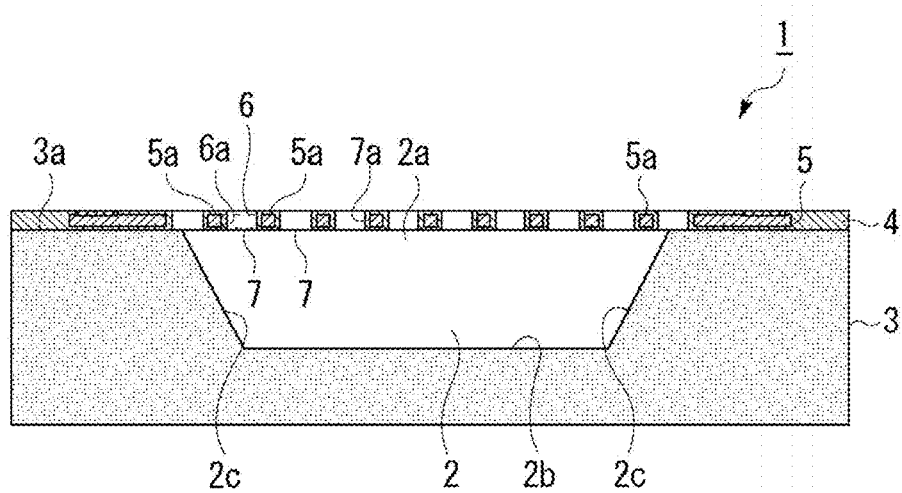
FIG. 2 is a cross-sectional view taken along A-A of the thermal sensor chip as illustrated in FIG. 1.

In this application example, a thermal conductivity-type sensor is explained. In the thermal conductivity-type sensor, the attained temperature of the heater or the power consumption of the heater changes according to the heat dissipation to the gas, and the thermal conductivity-type sensor yields an output according to the thermal conductivity of the gas. As illustrated in FIG. 1 and FIG. 2, a thermal sensor chip 1 provided in the thermal conductivity-type sensor according to this application example has a cavity 2 formed in a central portion of the substrate 3, constituted by monocrystalline silicon, of the thermal sensor chip 1, and has a heater 5 in a mesh form provided so as to cover the cavity 2.

The thermal sensor chip 1 according to this application example generates heat with the heater 5 in the mesh form provided in the membrane 4 constituted by a thin film, and detects the thermal conductivity of gas on the basis of the way the heat is generated by the heater 5. The thermal conductivity is different according to the type and concentration of gas, and accordingly, the thermal sensor chip 1 can use the thermal conductivity to determine the gas and detect the concentration of the gas. During detection, it is important to dissipate heat of the heater 5, as much as possible, to the gas to be detected. If heat is released to the substrate 3, change in the detection signal may decrease (i.e., the sensitivity may decrease), or the power consumption efficiency may decrease, due to a difference in the thermal conductivity of gas.

Therefore, in order to promote more efficient heat dissipation to the gas, the thermal sensor chip 1 employs the heater in the mesh form. In addition, first holes 6 formed in the heater in the mesh form are adopted as paths for supplying an etching solution, which contributes to reduction in the size of the chip and simplification of the process (i.e., reduction of the cost).

Furthermore, because the heater 5 is in the mesh form, and holes are provided between the wires, the contact area between the heater 5 and the gas can be increased. In this case, heat of the heater 5 is more efficiently dissipated to the gas, so that the detection sensitivity for detecting the thermal conductivity of the gas improves. Furthermore, heat of the heater 5 is efficiently transferred to the gas, so that the amount of heat released to the substrate 3 is alleviated, and the power consumption efficiency of the heater 5 can be improved.

Embodiment

Hereinafter, the thermal sensor chip according to an embodiment of the present disclosure is described in detail with reference to the drawings. In the following embodiment, for example, the thermal sensor chip according to the embodiment of the present disclosure is a MEMS (Micro Electro Mechanical Systems) sensor of a thermal type. A standard thermal conductivity-type sensor includes, in addition to a thermal sensor chip, a housing constituting the flow path and a circuit that drives the thermal sensor chip and processes the output signal (for example, a bridge circuit). The configuration of the housing and the circuit may be appropriately selected according to the configuration, application, and purpose of the thermal sensor chip of the present disclosure. Furthermore, the thermal sensor chip according to the present disclosure is not limited to the following configuration.

<Thermal Sensor Chip>

FIG. 1 is a plan view illustrating the thermal sensor chip 1 according to the embodiment. FIG. 2 is a cross-sectional view taken along A-A of the thermal sensor chip 1 as illustrated in FIG. 1. The thermal sensor chip 1 can be applied to a gas sensor that is incorporated into, for example, a gas meter, a combustion device, an internal combustion engine of an automobile and the like, a fuel cell, other industrial devices such as a medical device, and an embedded device, and that measures the amount of fluid that passes through a flow path.

The thermal sensor chip 1 includes: a substrate 3 in which a cavity 2 having an opening 2a is formed; a membrane 4 provided on a surface of the substrate 3 so as to cover the opening 2a; and a heater 5 provided on or inside the membrane 4. The heater 5 includes wires in a mesh form constituted by a conductive member. Examples of conductive members include platinum, polysilicon, and monocrystalline 2C silicon.

As illustrated in FIG. 1 and FIG. 2, in the heater 5, the wires are in the mesh form, and accordingly, the heater 5 has a lower resistance than a conventional meandering heater, so that the power consumption is reduced. Furthermore, while an increase of the resistance of the heater 5 is alleviated, the area of the heater 5 can be increased, and accordingly, the heat dissipation performance for dissipating heat to the gas to be detected can be increased.

The substrate 3 is constituted by a silicon-based material that can be processed by a semiconductor process, such as, for example, monocrystalline silicon and polycrystalline silicon. The substrate 3 according to the present embodiment is constituted by monocrystalline silicon in a rectangular shape, such that the plane direction of the surface 3a conforms to the (100) plane of the rectangular parallelepiped of the monocrystalline silicon, and the axial directions of edges 3b and 3c conform to the <110> directions of the rectangular parallelepiped of the monocrystalline silicon. Monocrystalline silicon is a material of which the shape is less likely to change in response to a change in the temperature and which can be readily processed with a high degree of accuracy by a semiconductor process. Furthermore, in a case where a cavity 2 is formed by etching of a semiconductor process, the use of monocrystalline silicon allows for easy control of the shape of the cavity 2. For example, the cavity 2 in a predetermined shape can be accurately formed in the surface of the substrate 3 by using anisotropic etching of crystals of silicon that is used in a manufacturing method explained later.

The membrane 4 may have any configuration so long as the membrane 4 can envelope a portion or the entirety of the heater 5, and the material constituting the membrane 4 is not particularly limited. In view of currents flowing through the heater 5, the material constituting the membrane 4 is preferably an insulating thin film that can be formed by a semiconductor process. In the present embodiment, the material constituting the heater 5 is polysilicon. Furthermore, although the entirety of the heater 5 according to the present embodiment is completely enveloped inside the membrane 4, the heater 5 does not have to be completely enveloped, and a portion of the heater 5 may be exposed to the outside or joined with other components. The membrane and the cavity 2 constitute a thin film having a hollow structure.

Furthermore, as illustrated in FIG. 1 and FIG. 2, in the heater 5 according to the present embodiment, the first holes 6 are regularly formed between the wires 5a. The plurality of first holes 6 according to the present embodiment include rhombic (rectangular) opening portions arranged in a staggered arrangement. In this case, heat of the heater 5 can be evenly dissipated to gas. The arrangement of the opening portions of the first holes 6 is not limited to the staggered arrangement, and may be a honeycomb arrangement or the like.

Furthermore, the heater 5 is provided with a pair of metal terminals 8, and the wires 5a include a plurality of conductive paths connected in parallel and connected in series between the pair of metal terminals 8. In this case, the resistance between the pair of metal terminals 8 can be reduced. The metal terminal 8 may be constituted by, for example, gold.

In the membrane 4, second holes 7 are formed at positions that overlap with the first holes 6 in a plan view of the surface of a substrate 3. In this case, heat can be dissipated not only from the surface of the heater 5 enveloped in the membrane 4 but also from inner walls 6a of the first holes 6. The inner wall 7a of the second holes 7 according to the present embodiment are constituted by portions of the membrane 4, and the wires 5a are not exposed, but in view of the heat dissipation performance, the second holes 7 may be formed such that the wires 5a are exposed through the inner walls 7a. Specifically, the first holes 6 and the second holes 7 may substantially overlap with each other, but are not required to completely coincides with each other. In the present embodiment, the above-described relationship between the first holes 6 and the second holes 7 is referred to as the first holes 6 being shared by the membrane 4 and the heater 5.

The cavity 2 is a recessed portion with a bottom portion, and the cavity has side surfaces 2c having a taper angle from the opening 2a toward the bottom portion 2b. Note that the side surfaces 2c correspond to the (111) plane of the monocrystalline silicon. The cavity 2 according to the present embodiment does not penetrate through the front and back surfaces of the substrate 3, and therefore, the rigidity of the entirety of the thermal sensor chip 1 including the substrate 3 increases. Furthermore, openings 12 and 13 serving as inlets and outlets of gas passing through the inside of the cavity 2 are provided in the membrane 4.

<Arrangement of First Holes 6 and Second Holes 7>

Figure 3A:
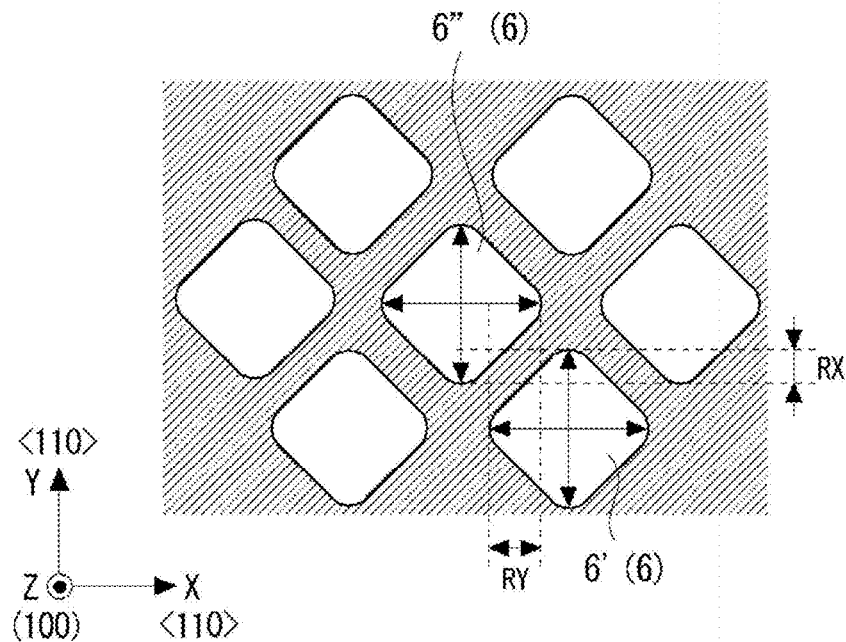
FIG. 3A is a drawing for explaining an arrangement of a plurality of first holes according to the embodiment.
Figure 3B:
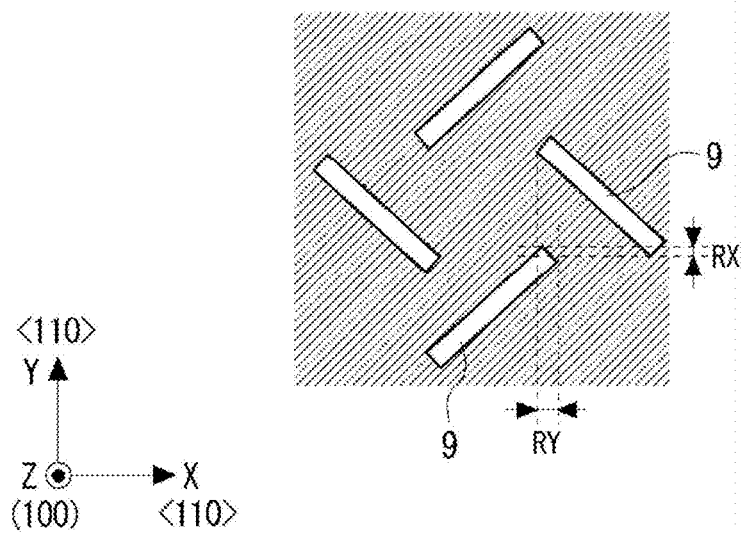
FIG. 3B is a drawing for explaining an arrangement of a plurality of first holes according to a modified embodiment.

In the present embodiment, the cavity 2 that is significantly larger than each of the first holes 6 and the second holes 7 can be formed by anisotropic etching of crystals of monocrystalline silicon. The first holes 6 and the second holes 7 are not required to completely coincide with each other, but in a case where the first holes 6 and the second holes 7 are used for the purpose of allowing an etching solution to permeate the cavity 2 during anisotropic etching of crystals, the first holes 6 and the second holes 7 substantially coincide with each other, so that the membrane 4 and the heater 5 share the first holes 6. Therefore, hereinafter, unless it is necessary to distinguish the first holes 6 and the second holes 7 from each other, the first holes 6 are intended to represent both of the first holes 6 and the second holes 7, and the first holes 6 and the second holes 7 are not individually referred to. FIG. 3A is a drawing for explaining an arrangement of the plurality of first holes 6 according to the embodiment. FIG. 3B is a drawing for explaining an arrangement of a plurality of first holes 9 according to a modified embodiment.

As illustrated in FIG. 3A, as viewed in an X axis direction <110> along an edge of monocrystalline silicon, a first hole 6' and another first hole 6" adjacent to the first hole 6 overlap with each other in an area RX. Similarly, as viewed in a Y axis direction <110> along an edge of monocrystalline silicon, the first hole 6' and the another first hole 6" adjacent to the first hole 6 overlap with each other in an area RY. This relationship is also applicable to other first holes 6 adjacent to each other.

Specifically, in at least the area of the mesh form of the heater 5, there is no area where the first hole 6 is not present as viewed in the X axis direction <110> of the substrate 3, and similarly, there is no area where the first hole 6 is not present as viewed in the Y axis direction <110> of the substrate 3. As a result, the single large cavity 2 in the predetermined shape can be formed by an etching solution supplied to the surface of the substrate 3 through the first holes 6. Therefore, the heat dissipation performance for dissipating heat to gas that passes through the cavity 2 is stabilized, and the detection sensitivity is less likely to vary due to individual difference of chips. Even in a case where the first holes 6 do not overlap with each other in the area RX and the area RY, side-etching slightly occurs in the X axis direction <110> and the Y axis direction <110> of the substrate 3, and therefore, connection with another adjacent hole can be made by increasing the time of etching. However, when the first holes 6 overlap with each other in the area RX and the area RY, such an excessive etching time is eliminated, and the etching process can be readily performed at a high quality.

Furthermore, even when a plurality of first holes 9 in a strip shape are regularly formed through the substrate 3 as illustrated in FIG. 3B, the single large cavity 2 in the predetermined shape can be formed, similar to the first holes 6 of FIG. 3A.

<Manufacturing Method>

Figure 4A:
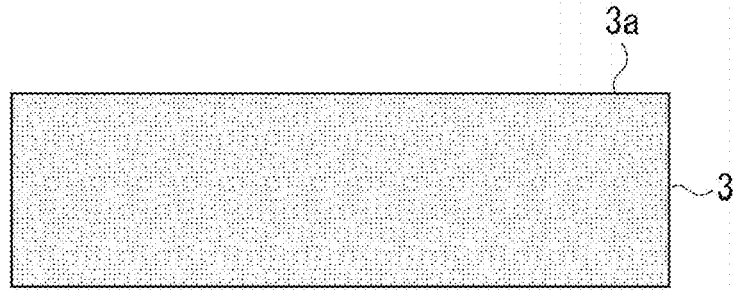
FIG. 4A to FIG. 4C are drawings for explaining manufacturing steps for manufacturing the thermal sensor chip according to the embodiment.
Figure 4B:
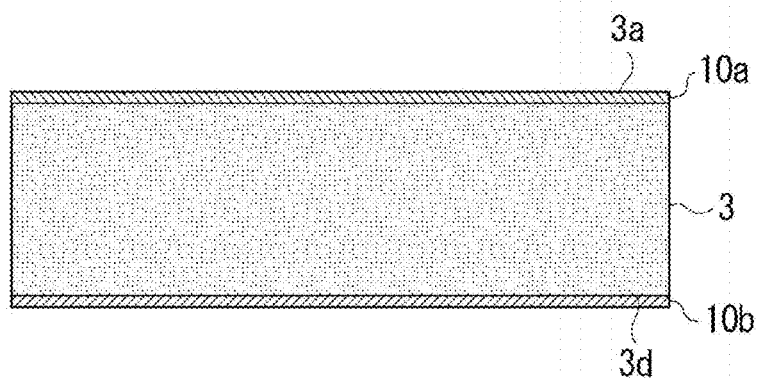
Figure 4C:
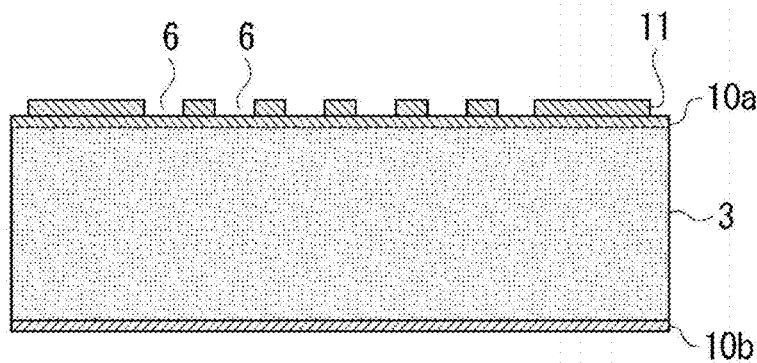
Figure 5A:
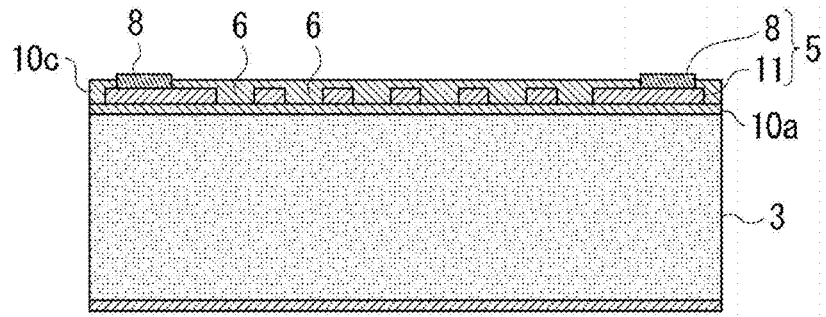
FIG. 5A to FIG. 5C are drawings for explaining manufacturing steps for the thermal sensor chip according to the embodiment.
Figure 5B:
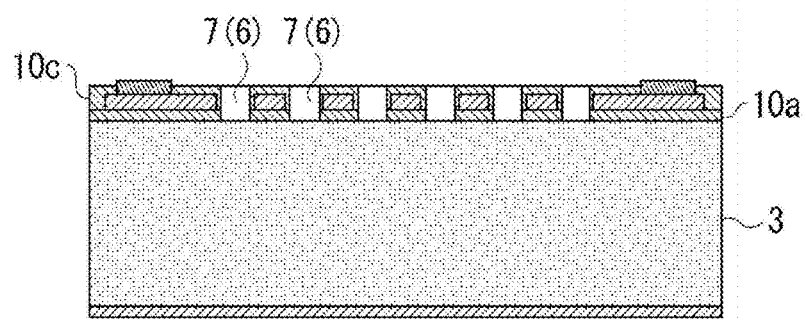
Figure 5C:
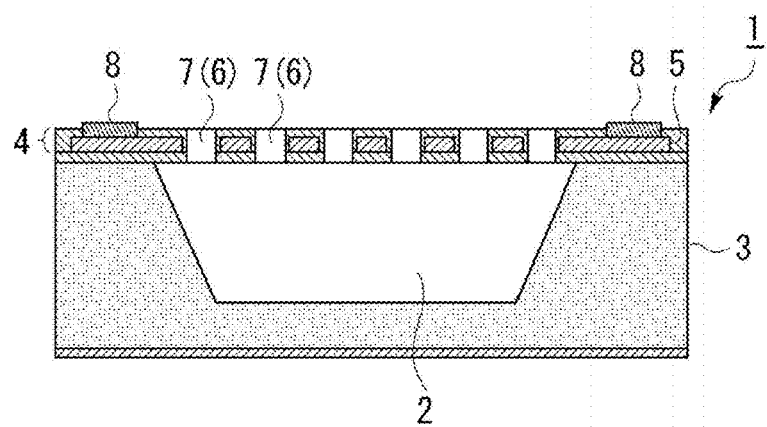

Next, the manufacturing method of the thermal sensor chip 1 is explained. FIG. 4A to FIG. 4C are drawings for explaining manufacturing steps for manufacturing the thermal sensor chip 1 according to the embodiment. FIG. 5A to FIG. 5C are drawings for explaining manufacturing steps subsequent to the manufacturing steps of FIG. 4A to FIG. 4C.

First, a substrate 3 constituted by monocrystalline silicon, of which the plane direction of a surface 3a of the substrate 3 is (100), is prepared. The substrate 3 has a rectangular shape in a plan view, and the direction of the X axis that is one of two edges orthogonal to each other and the direction of the 3C Y axis that is the other of the two edges orthogonal to each other conform to the <110> directions of the monocrystalline silicon (see FIG. 4A). Next, protective films 10a and 10b are formed on the surface 3a and a back surface 3d of the substrate 3 (see FIG. 4B). For example, the protective films 10a and 10b are constituted by silicon oxide (SiO$_2$) or silicon nitride (SiN). The protective film 10a becomes a portion of the film constituting the membrane 4.

Next, a conductive member film 11 that is made into a heater is deposited on the protective film 10a to form a predetermined pattern in a mesh form (see FIG. 4C). In the present embodiment, polycrystalline silicon is deposited by a low-pressure chemical vapor deposition (LPCVD) process. Next, the entirety of the conductive member film 11 is covered with a protective film 10c such as silicon nitride, openings are formed in portions of the protective film 10c, and metal terminals 8 are formed with a metal film such as gold in the portions where the openings are formed (see FIG. 5A).

Next, the protective films 10a and 10c filling the portions corresponding to the first holes 6 of the heater 5 are removed, and the second holes 7 are formed (see FIG. 5B). Thereafter, the cavity 2 can be readily formed by supplying a predetermined etching solution (potassium hydroxide (KOH) or 4-methylammonium hydroxide (TMAH)) to the surface of the substrate 3 through the first holes 6 (the second holes 7) (see FIG. 5C). Furthermore, because the cavity 2 can be formed after the membrane 4 and the heater 5 are formed on the substrate 3, the degree of freedom in the steps of the manufacturing process of the thermal sensor chip 1 increases.

The embodiment for carrying out the present disclosure has been hereinabove explained in detail as examples with reference to drawings. However, it is to be understood that the dimensions, materials, and relative arrangements of the components described in the embodiment are to be changed as appropriate depending on the configuration of an apparatus to which the present disclosure is applied and depending on various conditions. That is, the scope of the present disclosure is not limited to the above-mentioned embodiment, and the present disclosure also includes aspects in which the configurations of the embodiment are appropriately combined or replaced.

In order to allow comparison between the elements in the claims and the elements in the present disclosure, the claims of the present disclosure are recited with corresponding reference numerals of the drawings.

<Supplementary Note 1>

A thermal sensor chip (1) including:
a substrate (3) in which a cavity (2) having an opening (2a) is formed;
a membrane (4) provided on a surface (3a) of the substrate (3) so as to cover the opening (2a); and
a heater (5) provided on or inside the membrane 84),
wherein the heater (5) includes wires in a mesh form constituted by a conductive member.

DESCRIPTION OF SYMBOLS 1 thermal sensor chip
2 cavity
2a opening
3 substrate
4 membrane
5 heater
6 first hole
7 second hole
8 metal terminal

What is claimed is:

1. A thermal sensor chip comprising:
a substrate in which a cavity having an opening is formed;
a membrane provided on a surface of the substrate so as to cover the opening; and
a heater provided on or inside the membrane,
wherein the heater is a conductive film formed in a mesh pattern.

2. The thermal sensor chip according to claim 1, wherein the mesh pattern includes a surface perforated with a plurality of first holes.

3. The thermal sensor chip according to claim 2, wherein the mesh pattern is a staggered mesh form or a honeycomb mesh form.

4. The thermal sensor chip according to claim 2, wherein the membrane is an insulating material that envelopes the heater, the membrane being formed with a plurality of second holes at positions that overlap with the corresponding first holes in a plan view of the surface of the substrate.

5. The thermal sensor chip according to claim 2, wherein the substrate is a silicon-based material.

6. The thermal sensor chip according to claim 5, wherein the substrate is constituted by monocrystalline silicon in a rectangular shape, with a plane direction of the surface of the substrate matching a (100) plane of the monocrystalline silicon and sides of the rectangular shape match <110>directions of the monocrystalline silicon.

7. The thermal sensor chip according to claim 6, wherein one of the plurality of first holes overlaps with another of the plurality of first holes that is adjacent to the one of the plurality of first holes, as viewed in axial directions along the sides of the rectangular shape.

8. The thermal sensor chip according to claim 1, wherein the heater is provided with a pair of metal terminals, and
the conductive film includes a plurality of conductive paths connected in parallel and connected in series between the pair of metal terminals.

9. The thermal sensor chip according to claim 1, wherein the cavity is a recessed portion with a bottom portion, and
the cavity has side surfaces having a taper angle from the opening toward the bottom portion.

10. The thermal sensor chip according to claim 1, wherein the membrane includes openings serving as inlets and outlets of gas passing through an inside of the cavity.

11. The thermal sensor chip according to claim 1 is a gas sensor for determining a type of gas and detecting a concentration of the gas by detecting a thermal conductivity of the gas.

* * * * *